(12) United States Patent
Cho et al.

(10) Patent No.: US 8,994,264 B2
(45) Date of Patent: Mar. 31, 2015

(54) ORGANIC LIGHT EMITTING DISPLAY DEVICE AND METHOD OF MANUFACTURING THE SAME

(71) Applicant: Samsung Display Co., Ltd., Yongin-si, Gyeonggi-do (KR)

(72) Inventors: Sung-Hwan Cho, Yongin-si (KR); Kyong-Tae Park, Yongin-si (KR); Sang-Jo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/633,724

(22) Filed: Oct. 2, 2012

(65) Prior Publication Data

US 2013/0285538 A1    Oct. 31, 2013

(30) Foreign Application Priority Data

Apr. 27, 2012 (KR) .................. 10-2012-0044668

(51) Int. Cl.
| | |
|---|---|
| H01L 51/52 | (2006.01) |
| H01L 51/50 | (2006.01) |
| H01L 51/56 | (2006.01) |

(52) U.S. Cl.
CPC .............. *H01L 51/56* (2013.01); *H01L 51/50* (2013.01); *H01L 51/5012* (2013.01); *H01L 2251/105* (2013.01)
USPC .............. 313/504; 313/506; 313/512; 445/25

(58) Field of Classification Search
CPC ................... H01L 2224/1354; H01L 2224/1355–2224/1356; H01L 2224/273; H01L 2251/00–2251/105; H01L 2251/50–2251/558; H01L 2251/56; H01L 51/50–51/56; H01L 51/0004; H01L 51/0005; H01L 51/5036; H01L 51/5012; H01L 51/504
USPC ................................. 313/498–512; 445/24–25
See application file for complete search history.

(56) References Cited

U.S. PATENT DOCUMENTS 7,230,593 B2 *  6/2007  Nakanishi ...................... 345/80
7,304,437 B2 * 12/2007  Matsueda ................... 315/169.3

(Continued)

FOREIGN PATENT DOCUMENTS

| JP | 2007-080602 | 3/2007 |
| JP | 2010-092595 | 4/2010 |

(Continued)

*Primary Examiner* — Anne Hines
*Assistant Examiner* — Jose M Diaz
(74) *Attorney, Agent, or Firm* — Christie, Parker & Hale, LLP

(57) ABSTRACT

An organic light emitting display device and a method of manufacturing the same are provided. The organic light emitting display device includes: a substrate including a display portion displaying an image as a plurality of sub-pixels that are arranged, and a non-display portion extending at an edge of the display portion; and a sealant formed along a periphery of the display portion, wherein an organic film having an emissive layer is formed on the plurality of sub-pixels, and an emissive layer storage unit storing an emissive layer coated on the non-display portion is formed between the display portion and the sealant. By forming the emissive layer storage unit by removing at least a part of a pixel defining layer on an edge of the substrate, a raw material of the emissive layer coated on the non-display portion on the substrate is easily processed via the emissive layer storage unit.

21 Claims, 3 Drawing Sheets

(56) References Cited

U.S. PATENT DOCUMENTS

| | | | |
|---|---|---|---|
| 2009/0009075 A1* | 1/2009 | Seki et al. | 313/504 |
| 2009/0033215 A1* | 2/2009 | Horikiri et al. | 313/504 |
| 2009/0128020 A1* | 5/2009 | Takei et al. | 313/504 |
| 2009/0309489 A1* | 12/2009 | Takata et al. | 313/504 |
| 2011/0025189 A1* | 2/2011 | Kidu et al. | 313/498 |

FOREIGN PATENT DOCUMENTS

| | | |
|---|---|---|
| JP | 2011-054386 | 3/2011 |
| KR | 10-2004-0059702 A | 7/2004 |

* cited by examiner

ORGANIC LIGHT EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0044668, filed on Apr. 27, 2012, in the Korean Intellectual Property Office, the disclosure of which is incorporated herein in its entirety by reference.

BACKGROUND

1. Field

Aspects of the present invention relate to an organic light emitting display device, and a method of manufacturing the organic light emitting display device.

2. Description of the Related Art

Generally, an organic light emitting display device is a self-emitting display device having a wide viewing angle, excellent contrast, and a quick response time.

Accordingly, the organic light emitting display device is widely used as a display device for a mobile device, such as a digital camera, a video camera, a camcorder, a portable information terminal, a smart phone, an ultra-slim laptop, a tablet personal computer, and a flexible display device, or an electronic/electric product, such as a super-slim television.

The organic light emitting display device realizes various colors according to a principle of emitting light as holes and electrons respectively injected into an anode and a cathode, re-combine at an emissive layer, wherein light is emitted when the excitons generated as the injected holes and electrons combine, change from an excited state to a base state.

The organic light emitting display device has a stacked structure, wherein an organic emissive layer is inserted between an anode and a cathode. However, since it is difficult to obtain a high light emitting efficiency by using the stacked structure, an intermediate layer for increasing efficiency may be additionally inserted between the anode and/or the cathode, and the emissive layer.

Generally, the organic light emitting display device is manufactured by mixing a nozzle printing method and a deposition method. For example, the emissive layer may be formed by using the nozzle printing method and the intermediate layer may be formed by using the deposition method.

According to the nozzle printing method, a raw material of the emissive layer is coated on a substrate as a nozzle included in a nozzle device is moved from one position to another position. For example, the nozzle moves from outside the substrate towards the substrate.

An emissive layer storage tank is provided outside the substrate where the nozzle is moved. When the nozzle is located outside the substrate, the raw material of the emissive layer discharged from the nozzle is collected by and processed in the emissive layer storage tank. As such, an emissive layer processing apparatus, such as the emissive layer storage tank, is used at a substrate stage where the substrate is provided.

Also, during a coating process using the nozzle, the raw material of the emissive layer coated on an area excluding an emissive layer coated area on the substrate, for example, a pad area, is removed via a plasma process.

SUMMARY

Embodiments of the present invention provide an organic light emitting display device including an emissive layer storage unit on a substrate for processing of a raw material of an emissive layer remaining on an edge portion of the substrate, and a method of manufacturing the organic light emitting display device.

According to an embodiment of the present invention, there is provided an organic light emitting display device including: a substrate including a display portion having a plurality of sub-pixels for displaying an image, and a non-display portion extending from an edge of the display portion; a sealant formed along a periphery of the display portion; and an organic film having an emissive layer on the plurality of sub-pixels, wherein an emissive layer storage unit for storing a portion of the emissive layer coated at the non-display portion, is formed between the display portion and the sealant.

A pixel defining layer may be formed throughout the display portion and the non-display portion of the substrate, and the emissive layer storage unit may be formed by removing at least a part of the pixel defining layer formed at the non-display portion.

The emissive layer storage unit may be formed such that a thickness of the pixel defining layer formed at the non-display portion is less than a thickness of the pixel defining layer at other portions.

The emissive layer storage unit may be formed by completely or substantially removing a part of the pixel defining layer formed at the non-display portion.

The emissive layer may be formed for each of the plurality of sub-pixels by a nozzle that is configured to move back-and-forth between the display portion and the non-display portion along a direction of the substrate, and the emissive layer storage unit may be formed at two edge portions of the substrate in a direction in which the nozzle moves.

The emissive layer storage unit may have a groove shape extending along another direction of the substrate.

Each of the plurality of sub-pixels may be formed by opening a corresponding portion of the pixel defining layer formed at the display portion, and includes: a first electrode under a corresponding portion of the organic film and a second electrode on a corresponding portion of the organic film, wherein the first electrode, the organic film, and the second electrode may form an organic light emitting diode (OLED) by being stacked on each other for each of the plurality of sub-pixels, and the second electrode may be formed throughout the display portion and the non-display portion.

The emissive layer included in the organic film may be formed for each of the plurality of sub-pixels by a nozzle that is configured to move back-and-forth between the display portion and the non-display portion along a direction of the substrate, a portion of the emissive layer coated at the non-display portion may be located inside the emissive layer storage unit, and an edge portion of the second electrode may be formed so as to cover at least a portion of the emissive layer storage unit.

The emissive layer included in the organic film may be formed for each of the plurality of sub-pixels by a nozzle that is configured to back-and-forth between the display portion and the non-display portion along a direction of the substrate, a portion of the emissive layer coated at the non-display portion may be located inside the emissive layer storage unit, and an edge portion of the second electrode may be located on the pixel define pixel so as not to overlap the emissive layer storage unit.

The emissive layer storage unit may be formed by completely or substantially removing a part of the pixel defining layer in the non-display portion.

According to another embodiment of the present invention, there is provided an organic light emitting display device including: a substrate including a display portion having a plurality of sub-pixels for displaying an image, and a non-display portion extending from an edge of the display portion; a thin-film transistor (TFT) formed on the substrate; an organic light emitting diode (OLED) electrically connected to the TFT, and including a first electrode, an organic film having an emissive layer formed on the first electrode, and a second electrode formed on the organic film; a pixel defining layer having an opening for exposing a part of the first electrode, and forming each of the plurality of sub-pixels; and a sealant formed along a periphery of the display portion, wherein an emissive layer storage unit for storing a portion of the emissive layer coated at the non-display portion, is formed between the display portion and the sealant.

The pixel defining layer may be formed throughout the display portion and the non-display portion, and the emissive layer storage unit may be formed by removing at least a part of the pixel defining layer formed at the non-display portion.

The emissive layer storage unit may be formed such that a thickness of the pixel defining layer formed at the non-display portion is less than a thickness of the pixel defining layer at other portions.

The emissive layer storage unit may be formed by completely or substantially removing a part of the pixel defining layer formed at the non-display portion.

The emissive layer storage unit may be formed at two edge portions of the display portion along a direction of the substrate.

The emissive layer storage unit may have a groove shape extending along another direction of the substrate.

According to another embodiment of the present invention, there is provided a method of manufacturing an organic light emitting display device, the method including: forming a substrate including a display portion and a non-display portion; forming a plurality of sub-pixels in the display portion, each of the sub-pixels comprising an organic light emitting diode (OLED) having a first electrode, an organic film, and a second electrode; forming a pixel defining layer having an opening exposing a part of the first electrode for each of the plurality of sub-pixels throughout the display portion and the non-display portion, wherein the organic film includes an emissive layer on the exposed first electrode, and the second electrode covers the organic film on the substrate; and forming a sealant along a periphery of the display portion, wherein an emissive layer storage unit for storing a portion of the emissive layer coated at the non-display portion between the display portion and the sealant, is formed while forming the pixel defining layer.

The emissive layer storage unit may be formed by removing a part of the pixel defining layer formed at the non-display portion along a direction of the substrate.

The method may further including discharging a material of the emissive layer for each of the plurality of sub-pixels using a nozzle while continuously moving the nozzle between the display portion and the non-display portion along a direction of the substrate.

The emissive layer storage unit may be formed on two edge portions of the display portion in a direction in which the nozzle moves.

The nozzle may switch a direction at the emissive layer storage unit while moving back-and-forth between the display portion and the non-display portion, and the material of the emissive layer discharged to the non-display portion may be stored at the emissive layer storage unit.

The substrate may move in a direction intersecting a direction in which the nozzle is moved.

The emissive layer storage unit may be formed such that a thickness of the pixel defining layer formed at the non-display portion is less than a thickness of the pixel defining layer at other portions, by using a half-tone mask or a slit.

The emissive layer storage unit may have a groove shape extending along another direction of the substrate.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
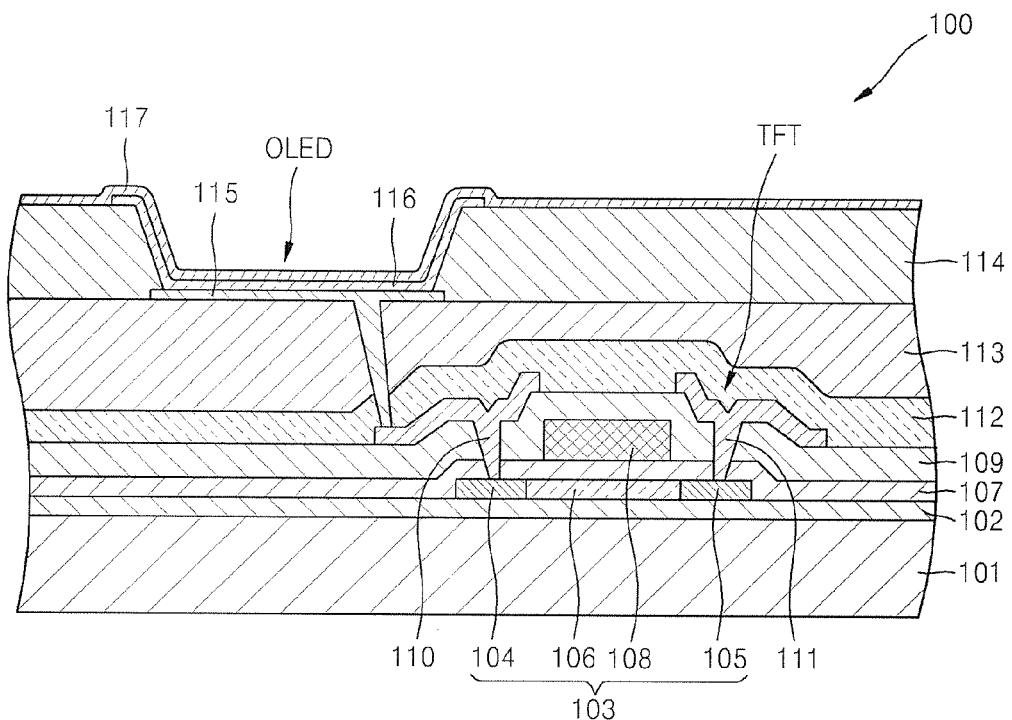
FIG. 1 is a cross-sectional view of a sub-pixel of an organic light emitting display device, according to an embodiment of the present invention.

As the present invention allows for various changes and numerous embodiments, particular embodiments will be illustrated in the drawings and described in detail in the written description. However, this is not intended to limit the present invention to particular modes of practice, and it will be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

An organic light emitting display device according to embodiments of the invention will be described below in more detail with reference to the accompanying drawings. Those components that are the same or are in correspondence are rendered by the same reference numeral regardless of the figure number, and redundant explanations may be omitted.

Figure 2:
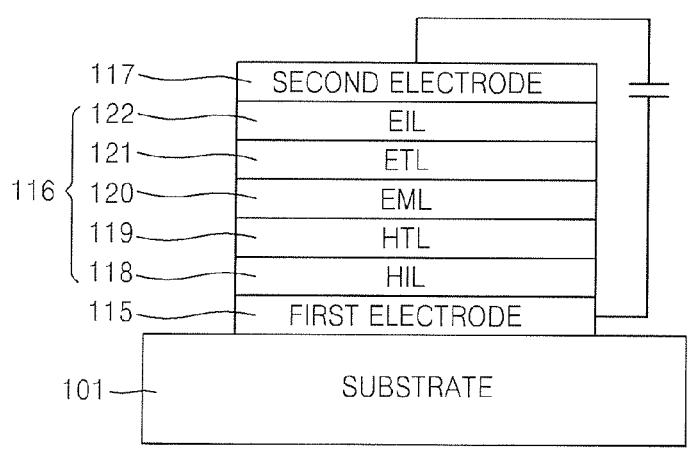
FIG. 2 is a diagram of a structure of an organic light emitting diode (OLED) of FIG. 1.

FIG. 1 is a cross-sectional view of a sub-pixel of an organic light emitting display device 100, according to an embodiment of the present invention, and FIG. 2 is a diagram of a structure of an organic light emitting diode (OLED) of FIG. 1.

Here, the sub-pixel includes at least one thin-film transistor (TFT) and an OLED. The number and structure of the TFT are not limited to those shown in FIG. 1, and may vary.

Referring to FIGS. 1 and 2, the organic light emitting display device 100 includes a substrate 101. The substrate 101 may be an insulation substrate formed of glass or plastic.

A buffer layer 102 is formed on the substrate 101. The buffer layer 102 may be formed of an organic material or an inorganic material, or may have a structure of an organic material and an inorganic material alternately stacked on each other. The buffer layer 102 prevents moisture or impurities generated from the substrate 101 from spreading.

The TFT is formed on the buffer layer 102. A semiconductor active layer 103 having a set or predetermined pattern is formed on the buffer layer 102. In several embodiments, the semiconductor active layer 103 is formed of polysilicon, or amorphous silicon, and then is crystallized to be changed into polysilicon.

Examples of a method of crystallizing amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

A source region 104 and a drain region 105 are formed at the semiconductor active layer 103 by doping N or P-type impurity ions. A region between the source region 104 and the drain region 105 is a channel region 106 where impurities are not doped.

A gate insulation film 107 is deposited on the semiconductor active layer 103. The gate insulation film 107 may be a single layer formed of silicon dioxide ($SiO_2$), or a double layer formed of $SiO_2$ and silicon nitride ($SiN_x$).

A gate electrode 108 is formed in a set or predetermined region on the gate insulation film 107. The gate electrode 108 is connected to a gate line (not shown) for applying a TFT on/off signal. The gate electrode 108 may be formed by using a single metal or multiple metals, and may be a single layer formed of molybdenum (Mo), molybdenum tungsten (MoW), chromium (Cr), aluminum (Al) alloy, magnesium (Mg), Al, nickel (Ni), W, or gold (Au), or a multilayer formed of a mixture of the above metals.

An interlayer insulation film 109 is formed on the gate electrode 108. A source electrode 110 is electrically connected to the source region 104 through a contact hole formed by removing a part of the interlayer insulation film 109, and a drain electrode 111 is electrically connected to the drain region 105. The interlayer insulation film 109 may be formed of an insulation material, such as $SiO_2$ or SiNx. Alternatively, the interlayer insulation film 109 may be formed of an insulation organic material.

A passivation film 112 formed of $SiO_2$ or SiNx, is formed on the source electrode 110 and the drain electrode 111. A planarization film 113 formed of an organic material, such as acryl, polyimide, or benzocyclobutene (BCB), is formed on the passivation film 112.

A display device (or a light-emitting device) is formed on the TFT. In the current embodiment, the OLED is used as the display device, but any one of various display devices may be used.

The OLED includes a first electrode 115, a second electrode 117, and an organic film 116 disposed between the first electrode 115 and the second electrode 117.

The first electrode 115 is electrically connected to any one of the source and drain electrodes 110 and 111.

The first electrode 115 operates as an anode from among electrodes included in the OLED, and may be formed of a suitable conductive material. The first electrode 115 may be a transparent or reflective electrode according to desired characteristics of the OLED.

For example, when the first electrode 115 is a transparent electrode, the first electrode 115 may be formed of an indium tin oxide (ITO), an indium zinc oxide (IZO), a zinc oxide (ZnO), or an indium oxide ($In_2O_3$). When the first electrode 115 is a reflective electrode, the first electrode 115 may be formed by forming a reflective film by using silver (Ag), Mg, Al, platinum (Pt), palladium (Pd), Au, Ni, neodymium (Nd), iridium (Ir), Cr, or a compound thereof, and then forming ITO, IZO, ZnO, or $In_2O_3$.

A pixel defining layer (PDL) 114 covering an edge of the first electrode 115 is formed on the planarization film 113. The PDL 114 is an insulation layer, and defines a light emitting region by surrounding and covering the edge of the first electrode 115.

The PDL 114 may be formed of an organic material or an inorganic material. For example, the PDL 114 may be formed of an organic material, such as polyimide, polyamide, benzocyclobutene, acryl resin, or a phenol resin, or an inorganic material, such as SiNx. The PDL 114 may be a single layer or a multilayer of at least two layers.

The organic film 116 is formed on the first electrode 115 that is exposed by an opening of the PDL 114. The second electrode 117 is formed on the organic film 116.

The first and second electrodes 115 and 117 are insulated from each other by the organic film 116, and voltages having different polarities are applied to the organic film 116 such that the organic film 116 emits a light.

In the current embodiment, the organic film 116 is patterned to correspond only to a sub-pixel, e.g., the patterned first electrode 115. However, the organic film 116 is illustrated as such to conveniently describe a structure of a sub-pixel, and the organic film 116 may be integrally formed with an adjacent sub-pixel. Alternatively, some layers of the organic film 116 may be formed according to multiple sub-pixels, whereas other layers may be integrally formed with the organic film 116 in an adjacent sub-pixel.

The organic film 116 may include a low molecular or polymer organic material.

As shown in FIG. 2, when the organic film 116 is formed of a low molecular organic material, the organic film 116 is formed by stacking a hole injection layer (HIL) 118, a hole transport layer (HTL) 119, an emissive layer (EML) 120, an electron transport layer (ETL) 121, and an electron injection layer (EIL) 122 in a single or complex structure on a surface of the first electrode 115.

When the organic film 116 is formed of a polymer organic material, the organic film 116 includes a HTL and an EML.

Referring back to FIG. 1, the structure of the organic film 116 is not limited thereto and may have various structures.

The second electrode 117 may be a transparent electrode like the first electrode 115, but alternatively may be a reflective electrode.

When the second electrode 117 is a transparent electrode, the second electrode 117 may be formed by depositing a metal having a low work function, such as lithium (Li), calcium (Ca), lithium fluoride (LiF)/Ca, LiF/Al, Al, Mg, or a compound thereof on the organic film 116, and then forming an auxiliary electrode formed of a transparent electrode forming material, such as ITO, IZO, ZnO, or $In_2O_3$.

When the second electrode 117 is a reflective electrode, the second electrode 117 is formed by depositing Li, Ca, LiF/Ca, LiF/Al, Al, Mg, or a compound thereof.

In several embodiments, while the first electrode 115 is formed as a transparent electrode or a reflective electrode, the first electrode 115 may have a shape corresponding to an opening shape of each sub-pixel. In several embodiments, the second electrode 117 may be formed by depositing a transparent or reflective electrode on an entire surface of a display region. However, the second electrode 117 may not be deposited on the entire surface, and may have various patterns. Here, the first and second electrodes 115 and 117 may be stacked in a way that is opposite to the manner described above.

Here, an EML storage unit for storing the EML 120 coated on a non-display portion may be formed at an edge portion of the substrate 101. This will be described in more detail below.

Figure 3:
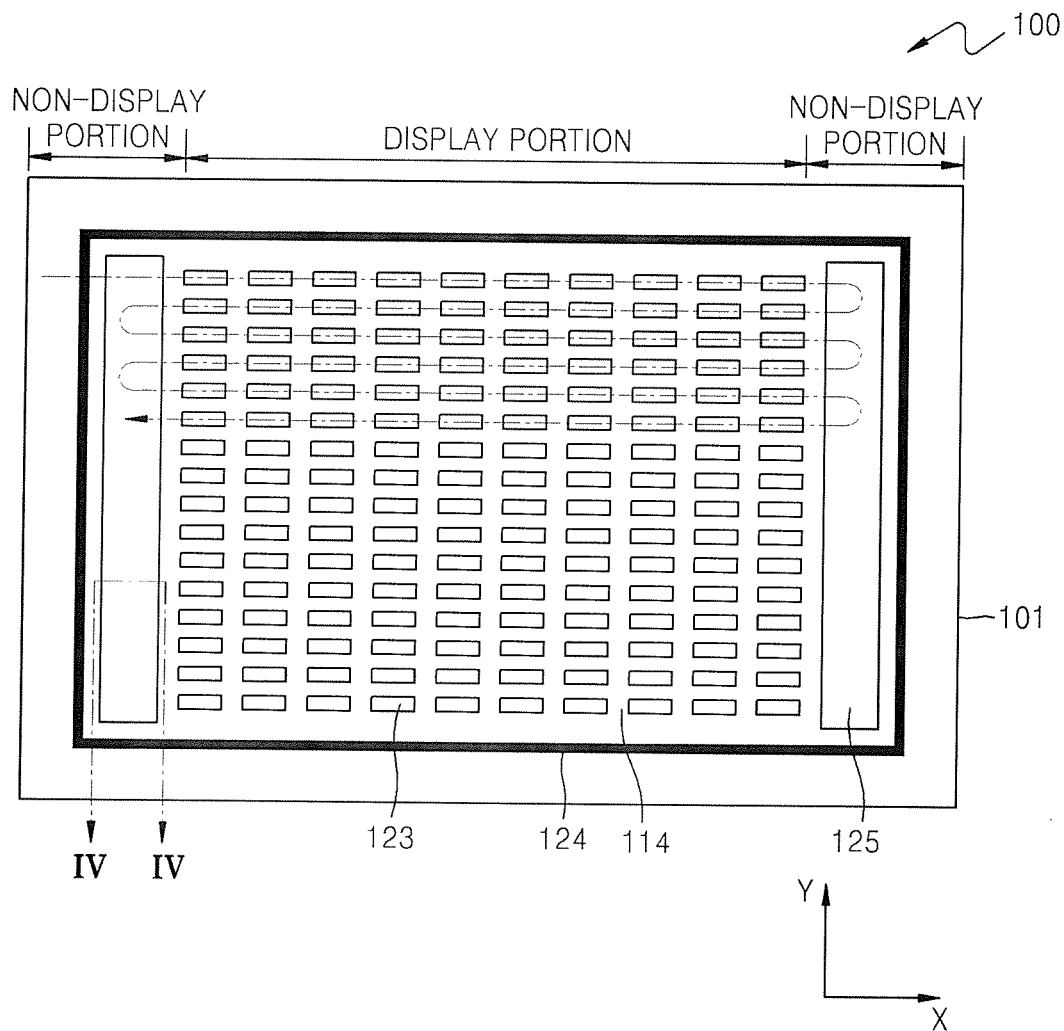
FIG. 3 is a plan view of the organic light emitting display device of FIG. 1 including an emissive layer storage unit on a substrate, according to an embodiment of the present invention.
Figure 4:
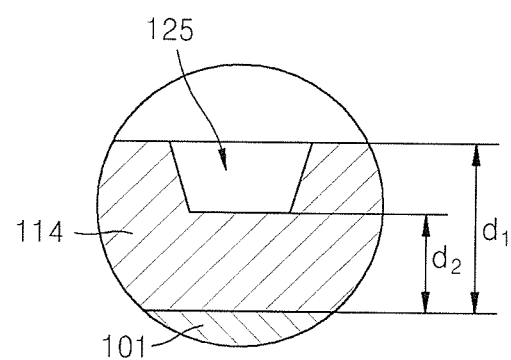
FIG. 4 is a cross-sectional view taken along a line IV-IV of FIG. 3.

FIG. 3 is a plan view of the organic light emitting display device 100 of FIG. 1 including an EML storage unit 125 on the substrate 101, according to an embodiment of the present invention, and FIG. 4 is a cross-sectional view taken along a line IV-IV of FIG. 3.

Referring to FIGS. 3 and 4, the substrate 101 includes a display portion having a plurality of sub-pixels 123 for displaying an image, and a non-display portion extending at an edge portion of the display portion. A sealant 124 is disposed on the non-display portion, and the sealant 124 is formed along a periphery of the display portion.

The sub-pixels 123 are formed by opening a part of the PDL 114 of FIG. 1. The organic film 116 of FIG. 1 is patterned according to the colors to be emitted in the sub-pixel 123. The organic film 116 includes the EML 120 of FIG. 2.

In the current embodiment, the organic film 116 includes EMLs 120 of red, green, and blue, wherein the EMLs 120 of red, green, and blue are formed for each sub-pixel 123. In other words, the EMLs 120 of a same color are continuously arranged on each sub-pixel 123 along one direction (e.g., X-direction) of the substrate 101, and EMLs 120 of different colors are alternately arranged on each sub-pixel along another direction (e.g., Y-direction) of the substrate 101. The PDL 114 opening for the sub-pixel 123 is formed in a region between a pair of sub-pixels 123 adjacent in the X and Y-directions.

The EML 120 is formed according to the sub-pixels 123 via a printing method, such as a nozzle printing method. Accordingly, a nozzle included in a nozzle device moves on or above the substrate 101 to discharge ink droplets of a color corresponding to the EML 120 to be formed in each sub-pixel 123, and after the ink droplets fill each sub-pixel 123, the EML 120 is formed by drying the ink droplets.

Here, for convenience of processes, as shown by an arrow of an alternated long and short dash line, the nozzle moves at a substantially constant velocity while continuously moving along the one direction (X-direction) of the substrate 101 so as to discharge ink droplets of a color corresponding to each sub-pixel 123.

In this embodiment, the nozzle repeats the operations of moving in an order of a left non-display portion, a display portion, and a right non-display portion of the substrate 101 of FIG. 3 to discharge ink droplets of a color corresponding to each sub-pixel 123 on the substrate 101, turning at the right non-display portion, moving in an order of the right non-display portion, the display portion, and the left non-display portion to discharge ink droplets, and then turning at the left non-display portion, thereby discharging ink droplets of color corresponding to each sub-pixel 123. As such, a process of using a nozzle to coat ink droplets constituting a raw material of an EML, is performed without stopping the nozzle.

Here, the substrate 101 moves along the other direction (Y-direction) intersecting the one direction (X-direction) of the moving nozzle by a pitch interval of the sub-pixels 123. A moving speed of the nozzle is relatively faster than a moving speed of the substrate 101, and such a relative movement is helpful in terms of takt time (or cycle time).

Here, as shown by the arrow of the alternated long and short dash line, a region where the nozzle turns around on the substrate 101 is a region between the display portion where the sub-pixels 123 are arranged, and the sealant 124. In the left non-display portion and the right non-display portion constituting the regions where the nozzle turns as described above, a circuit pattern may be formed below the PDL 114.

The EML storage unit 125 for storing the ink droplets discharged from the nozzle that performs a coating process continuously on the substrate 101, is formed in the region where the nozzle turns.

The EML storage unit 125 is formed by removing at least a part of the PDL 114 covering the left non-display portion and the right non-display portion. In other words, the EML storage unit 125 may be formed while forming the PDL 114 by forming the PDL 114 with a thickness d2 in the left and right non-display portions and forming the PDL 114 with a thickness d1 that is greater than d2. The EML storage unit 125 provides a space for storing ink droplets discharged from the nozzle while the nozzle turns at the left and right non-display portions. The EML storage unit 125 is formed at two edge portions of the substrate 101 in a direction in which the nozzle proceeds.

The EML storage unit 125 may include a plurality of independent grooves extending along a line of the left and right non-display portions where the nozzle moves. In one embodiment, the EML storage unit 125 includes one groove having a large diameter formed on each of the left and right non-display portions according to manufacturing processes. According to the current embodiment, the EML storage unit 125 may be formed as one groove in each of the left and right non-display portions extending in the other direction (Y-direction) of the substrate 101 intersecting the one direction (X-direction) in which the nozzle moves back-and-forth.

Accordingly, the nozzle discharges ink droplets of a color corresponding to each sub-pixel 123 while moving along the one direction (X-direction) of the substrate 101. While the nozzle turns at the left and right non-display portions, the ink droplets discharged from the nozzle are stored in the EML storage unit 125. Also, ink droplets may be continuously coated on the substrate 101 that moves along the Y-direction at the pitch interval of the sub-pixels 123. The Y-direction intersects the X-direction in which the nozzle moves back-and-forth.

The EML storage unit 125 may be formed while forming the PDL 114 by exposing the PDL 114 to light to have different thicknesses by using, for example, a half tone mask. In one embodiment, the EML storage unit 125 may be formed by using a slit exposure method.

Alternatively, the EML storage unit 125 may be formed by completely or substantially removing the PDL 114 in the non-display portion, or by forming the PDL 114 in the non-display portion to have the thickness d2 that is half of the thickness d1. However, a method of forming the EML storage unit 125 is not limited as long as a space for storing ink droplets is obtained in the non-display portion.

Figure 5:
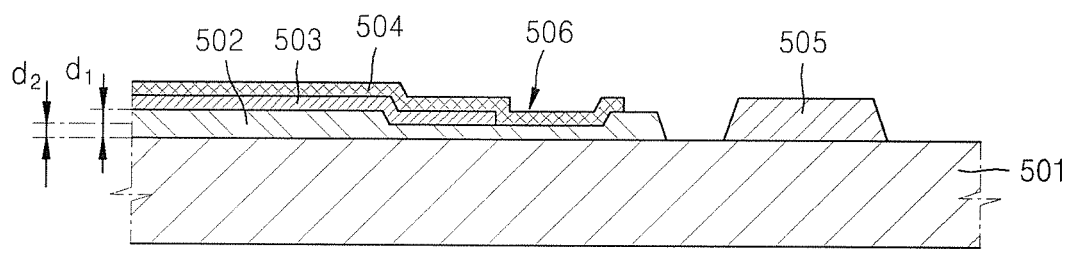
FIG. 5 is a cross-sectional view of a portion where an emissive layer storage unit is formed, according to an embodiment of the present invention.
Figure 6:
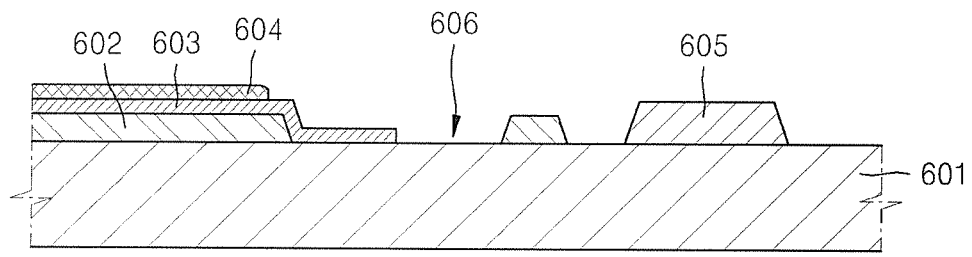
FIG. 6 is a cross-sectional view of a portion where an emissive layer storage unit is formed, according to another embodiment of the present invention.
Figure 7:
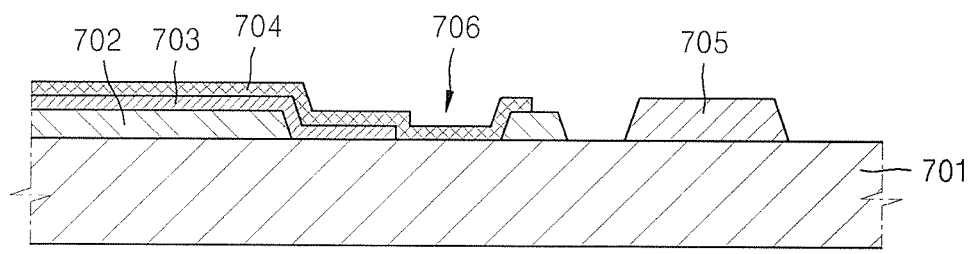
FIG. 7 is a cross-sectional view of a portion where an emissive layer storage unit is formed, according to another embodiment of the present invention.

FIGS. 5, 6, and 7 respectively illustrate EML storage units 506, 606, and 706 according to embodiments of the present invention.

Hereinafter, each of the regions of substrates 501, 601, and 701 respectively shown in FIGS. 5, 6, and 7, corresponds to a region extending from the display portion where sub-pixels are arranged, to a non-display portion, and to an edge portion of the substrate.

Referring to FIG. 5, a PDL 502 is formed on the substrate 501. The PDL 502 has an opening for forming a sub-pixel, and extends from the display portion to the non-display portion. A sealant 505 is formed at the edge portion of the substrate 501.

Here, an EML storage unit 506 is formed between the region extending from the display portion to the non-display portion, and the sealant 505 by removing a part of the PDL 502. The EML storage unit 506 may be formed by using a half tone mask or a slit. A thickness d2 of the EML storage unit 506 may be less than a thickness d1 of the PDL 502 in other portions. In the current embodiment, the thickness d2 of the EML storage unit 506 is half of the thickness d1 of the PDL 502 in other portions due to half etching.

A nozzle moving on or above the substrate 501 discharges ink droplets 503 of a color corresponding to each sub-pixel, discharges the ink droplets 503 on the PDL 502 corresponding to a region between a pair of sub-pixels, and turns at or above the EML storage unit 506 formed on the non-display portion.

Here, the ink droplets 503 discharged from the nozzle while switching a direction on the non-display portion are stored in the EML storage unit 506. Accordingly, the ink droplets 503 discharged from the nozzle does not substantially affect an entire thickness of the substrate 501, and does not substantially intrude upon the sealant 505.

Here, after completing the coating of the ink droplets 503, a second electrode 504 is formed on the ink droplets 503. Since the second electrode 504 is a common layer, the second electrode 504 is formed throughout the substrate 501 from the display portion to the non-display portion. In the current embodiment, the second electrode 504 is formed to cover the EML storage unit 506.

Referring to FIG. 6, a PDL 602 is formed on the substrate 601. A sealant 605 is formed at an outermost edge portion of the substrate 601.

Here, unlike FIG. 5, the EML storage unit 606 is formed by completely or substantially removing a part of the PDL 602 between the region extending from the display portion to the non-display portion, and the sealant 605.

Ink droplets 603 may be stored in the EML storage unit 606 where the nozzle moving on or above the substrate 601 turns. By completely or substantially removing the part of the PDL 602, the amount of ink droplets 603 stored in the EML storage unit 606 may be increased.

Here, after completing the coating of the ink droplets 603, a second electrode 604 is formed on the ink droplets 603. Here, the second electrode 604 is not formed on the EML storage unit 606 so as not to overlap with the ink droplets 603 stored in the EML storage unit 606. Accordingly, an effect on an entire thickness of the substrate 601 due to the forming of the ink droplets 603 and second electrode 604 may be decreased.

Referring to FIG. 7, a PDL 702 is formed on the substrate 701. A sealant 705 is formed at an outermost edge portion of the substrate 701.

Here, unlike FIG. 5, the EML storage unit 706 is formed by completely or substantially removing a part of the PDL 702 between the region extending from the display portion to the non-display portion, and the sealant 705. Ink droplets 703 may be stored in the EML storage unit 706 where the nozzle moving on or above the substrate 701 turns.

Here, after completing the coating of the ink droplets 703, a second electrode 704 is formed on the ink droplets 703. Here, unlike FIG. 6, the second electrode 704 is formed to cover the EML storage unit 706. Since the ink droplets 703 form an organic film after being dried, like the PDL 702, the second electrode 704 may cover the ink droplets 703.

As described above, according to the organic light emitting display device and the method of manufacturing the same of the embodiments of the present invention, the raw material of the EML coated on the non-display portion on the substrate at the EML storage unit can be easily processed by forming the EML storage unit by removing at least a part of the PDL at the edge portion of the substrate.

Also, a plasma processing operation for removing the raw material of the EML coated on the non-display portion on the substrate is not required.

In addition, a separate EML storage tank may not be prepared at a substrate stage, and since the nozzle is not moved outside the substrate, a manufacturing apparatus is simplified, thereby reducing an installation area.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. An organic light emitting display device comprising:
    a substrate comprising a display portion having a plurality of sub-pixels for displaying an image, and a non-display portion extending from an edge of the display portion;
    a sealant formed along a periphery of the display portion;
    a pixel defining layer at the display portion and the non-display portion of the substrate; and
    an organic film having an emissive layer on the plurality of sub-pixels,
    wherein an emissive layer storage unit for storing a portion of the emissive layer coated at the non-display portion, is formed between the display portion and the sealant and between a first portion and a second portion of the pixel defining layer that are spaced from each other, and
    wherein the emissive layer continuously extends from the display portion to about the middle of the emissive layer storage unit, partially between the first portion and the second portion of the pixel defining layer.

2. The organic light emitting display device of claim 1, wherein the emissive layer storage unit is formed such that a thickness of the pixel defining layer formed at the non-display portion is less than a thickness of the pixel defining layer at other portions.

3. The organic light emitting display device of claim 1, wherein the emissive layer storage unit is formed by completely or substantially removing the pixel defining layer formed at the non-display portion.

4. The organic light emitting display device of claim 1, wherein the emissive layer is formed for each of the plurality of sub-pixels by a nozzle that is configured to move back-and-forth between the display portion and the non-display portion along a direction of the substrate, and wherein the emissive layer storage unit is formed at two edge portions of the substrate in a direction in which the nozzle moves.

5. The organic light emitting display device of claim 4, wherein the emissive layer storage unit has a groove shape extending along another direction of the substrate.

6. The organic light emitting display device of claim 1, wherein each of the plurality of sub-pixels is formed by opening a corresponding portion of the pixel defining layer formed at the display portion, and comprises:
   a first electrode under a corresponding portion of the organic film; and
   a second electrode on a corresponding portion of the organic film,
   wherein the first electrode, the organic film, and the second electrode form an organic light emitting diode (OLED) by being stacked on each other for each of the plurality of sub-pixels, and
   the second electrode is formed throughout the display portion and the non-display portion.

7. The organic light emitting display device of claim 6, wherein the emissive layer included in the organic film is formed for each of the plurality of sub-pixels by a nozzle that is configured to move back-and-forth between the display portion and the non-display portion along a direction of the substrate,
   a portion of the emissive layer coated at the non-display portion is located inside the emissive layer storage unit, and
   an edge portion of the second electrode is formed so as to cover at least a portion of the emissive layer storage unit.

8. The organic light emitting display device of claim 6, wherein the emissive layer included in the organic film is formed for each of the plurality of sub-pixels by a nozzle that is configured to move back-and-forth between the display portion and the non-display portion along a direction of the substrate,
   a portion of the emissive layer coated at the non-display portion is located inside the emissive layer storage unit, and
   an edge portion of the second electrode is located on the pixel define pixel so as not to overlap the emissive layer storage unit.

9. The organic light emitting display device of claim 8, wherein the emissive layer storage unit is formed by completely or substantially removing a part of the pixel defining layer at the non-display portion.

10. An organic light emitting display device comprising:
    a substrate comprising a display portion having a plurality of sub-pixels for displaying an image, and a non-display portion extending from an edge of the display portion;
    a thin-film transistor (TFT) formed on the substrate;
    an organic light emitting diode (OLED) electrically connected to the TFT, and comprising a first electrode, an organic film having an emissive layer formed on the first electrode, and a second electrode formed on the organic film;
    a pixel defining layer having an opening for exposing a part of the first electrode, and forming each of the plurality of sub-pixels wherein the pixel defining layer is at the display portion and the non-display portion; and
    a sealant formed along a periphery of the display portion,
    wherein an emissive layer storage unit for storing a portion of the emissive layer coated at the non-display portion, is formed between the display portion and the sealant and between a first portion and a second portion of the pixel defining layer that are spaced from each other, and wherein the emissive layer continuously extends from the display portion to about the middle of the emissive layer storage unit, partially between the first portion and the second portion of the pixel defining layer.

11. The organic light emitting display device of claim 10, wherein the emissive layer storage unit is formed such that a thickness of the pixel defining layer formed at the non-display portion is less than a thickness of the pixel defining layer at other portions.

12. The organic light emitting display device of claim 10, wherein the emissive layer storage unit is formed by completely or substantially removing a part of the pixel defining layer formed at the non-display portion.

13. The organic light emitting display device of claim 10, wherein the emissive layer storage unit is formed at two edge portions of the display portion along a direction of the substrate.

14. The organic light emitting display device of claim 13, wherein the emissive layer storage unit has a groove shape extending along another direction of the substrate.

15. A method of manufacturing an organic light emitting display device, the method comprising:
    forming a substrate comprising a display portion and a non-display portion;
    forming a plurality of sub-pixels in the display portion, each of the sub-pixels comprising an organic light emitting diode (OLED) having a first electrode, an organic film, and a second electrode;
    forming a pixel defining layer having an opening exposing a part of the first electrode for each of the plurality of sub-pixels throughout the display portion and the non-display portion,
    wherein the organic film comprises an emissive layer on the exposed first electrode, and the second electrode covers the organic film on the substrate; and forming a sealant along a periphery of the display portion,
    wherein an emissive layer storage unit for storing a portion of the emissive layer coated at the non-display portion between the display portion and the sealant and between a first portion and a second portion of the pixel defining layer that are spaced from each other, is formed while forming the pixel defining layer,
    wherein the emissive layer continuously extends from the display portion to about the middle of the emissive layer storage unit, partially between the first portion and the second portion of the pixel defining layer.

16. The method of claim 15, further comprising discharging a material of the emissive layer for each of the plurality of sub-pixels using a nozzle while continuously moving the nozzle between the display portion and the non-display portion along a direction of the substrate.

17. The method of claim 16, wherein the emissive layer storage unit is formed at two edge portions of the display portion in a direction in which the nozzle moves.

18. The method of claim 16, wherein the nozzle switches a direction at the emissive layer storage unit while moving back-and-forth between the display portion and the non-display portion, and the material of the emissive layer discharged to the non-display portion is stored at the emissive layer storage unit.

19. The method of claim 16, wherein the substrate moves in a direction intersecting a direction in which the nozzle is moved.

20. The method of claim 15, wherein the emissive layer storage unit is formed such that a thickness of the pixel defining layer formed at the non-display portion is less than a thickness of the pixel defining layer at other portions, by using a half-tone mask or a slit.

21. The method of claim 15, wherein the emissive layer storage unit has a groove shape extending along another direction of the substrate.

\* \* \* \* \*